United States Patent
Huang et al.

(10) Patent No.: US 6,504,461 B2
(45) Date of Patent: Jan. 7, 2003

(54) OPEN MAGNET WITH RECESSED FIELD SHAPING COILS

(75) Inventors: Xianrui Huang, Clifton Park, NY (US); Michael Anthony Palmo, Jr., Ballston Spa, NY (US); Evangelos Trifon Laskaris, Niskayuna, NY (US); Bruce Campbell Amm, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 09/949,623

(22) Filed: Sep. 10, 2001

(65) Prior Publication Data

US 2002/0135450 A1 Sep. 26, 2002

Related U.S. Application Data

(63) Continuation-in-part of application No. 09/681,371, filed on Mar. 26, 2001.

(51) Int. Cl.[7] .............................. G01V 3/00; H01F 5/00
(52) U.S. Cl. ...................... 335/296; 335/216; 335/297; 335/301; 324/319; 324/320
(58) Field of Search .................... 335/216, 296–306; 324/318, 319, 320

(56) References Cited

U.S. PATENT DOCUMENTS

| 3,409,806 | A | | 11/1968 | Fritz | |
| 4,723,116 | A | * | 2/1988 | Muller et al. | 324/320 |
| 5,402,094 | A | | 3/1995 | Enge | 335/296 |
| 5,565,831 | A | * | 10/1996 | Dorri et al. | 324/318 |
| 5,874,880 | A | | 2/1999 | Laskaris et al. | 335/216 |
| 5,883,558 | A | * | 3/1999 | Laskaris et al. | 324/318 |
| 5,999,075 | A | | 12/1999 | Laskaris et al. | 335/299 |
| 6,002,255 | A | | 12/1999 | Pulyer | 324/320 |
| 6,130,538 | A | | 10/2000 | Carrozzi et al. | 324/319 |
| 6,172,588 | B1 | | 1/2001 | Laskaris et al. | 335/299 |

FOREIGN PATENT DOCUMENTS

| EP | 0 927 889 A | 7/1999 |
| WO | 01 31361 A | 3/2001 |

* cited by examiner

Primary Examiner—Ramon O. Barrera
(74) Attorney, Agent, or Firm—Jean K. Testa; Patrick K. Patnode

(57) ABSTRACT

A pole piece for use in an open magnet includes a magnetizable body of generally cylindrical shape and made of a ferromagnetic material with a plurality of concentrically-arranged, annular-shaped, radially spaced-apart grooves formed in the inner surface of the pole piece. A plurality of annular-shaped, electrically conductive coils are disposed within the grooves. The pole piece with recessed shielding coils is situated within a cryogenic vessel to maintain the pole pieces at a uniform cryogenic temperature. The result is an open magnet structure which provides a highly uniform, high field, open field of view for MRI with a well-contained stray field.

13 Claims, 4 Drawing Sheets

OPEN MAGNET WITH RECESSED FIELD SHAPING COILS

This application is a continuation in part of application Ser. No. 09/681,371, filed Mar. 26, 2001.

BACKGROUND OF THE INVENTION

The present invention generally relates to open magnets used in magnetic resonance imaging (MRI) systems and, more particularly, to such an open magnet with recessed field shaping coils.

As described in U.S. Pat. No. 5,999,075 to Laskaris et al. assigned to the assignee of the present invention, an open magnet of a MRI system typically includes two spaced-apart coil assemblies which are substantially mirror images of one another. The space between the coil assemblies contains an imaging volume and allows for positioning of a patient in that volume and access by medical personnel for surgery or other medical procedures during magnetic resonance imaging. Each coil assembly typically has an annular-shaped main coil with a longitudinal axis, an annular-shaped shielding coil coaxially aligned along the longitudinal axis and spaced longitudinally outward and apart from the main coil, and a cylindrical-shaped magnetizable pole piece disposed about the longitudinal axis between the main and shielding coils.

The magnetizable pole pieces of the coil assemblies enhance the strength of the magnetic field produced by the main coils. Further, by selectively configuring the inner surfaces of the pole pieces, the open magnet is magnetically shimmed so as to improve homogeneity of the magnetic field. The current practice is to form several annular steps on the inner surfaces of the pole pieces which protrude to different heights or distances into the space between the coil assemblies in order to control the magnetization distributions of the pole pieces and thus shape the magnetic field to create the homogeneous field volume in the space between the coil assemblies for MRI imaging. However, such magnetic field shaping annular steps occupy some of the space between the coil assemblies thus reducing the imaging volume of the MRI system and complicating the magnet cryogenic structure design. Moreover, the field shaping capacity of the step technique is limited and reduced as the main field increases since more load areas of the stepped pole pieces become magnetically saturated.

Accordingly, it is desirable to provide an open magnet which provides a highly uniform, high field, open field of view for MRI with a well-contained stray field.

BRIEF SUMMARY OF THE INVENTION

An actively shielded open magnet useful for MRI applications comprises magnetized pole pieces, superconducting main and bucking coils, and recessed field shaping coils to provide a highly homogeneous, high field, open field of view for MR imaging with a wellcontained stray field.

The magnetized pole pieces comprise a ferromagnetic material and have superconducting field-shaping coils situated in annular grooves formed in the pole face. The magnetized pole pieces with annular recessed field-shaping coils are placed inside a cryogenic helium vessel of the magnet. The uniform cryogenic temperature inside the cryogenic vessel avoids the field fluctuation that would otherwise result from temperature changes of the pole pieces. A pair of superconducting main coils generates the high magnet field in the imaging volume. Unlike many of the open MRI magnets with warm iron poles, the cold magnetized pole pieces do not form a return path for the magnetic flux. Instead, the stray field is contained by the superconducting bucking coils.

The recessed field shaping coils advantageously result in more usable space between the two coil assemblies of the open magnet, enable higher field and simplify the manufacturing of the pole pieces and the magnet cryostat structure.

DETAILED DESCRIPTION OF THE INVENTION

Figure 1:
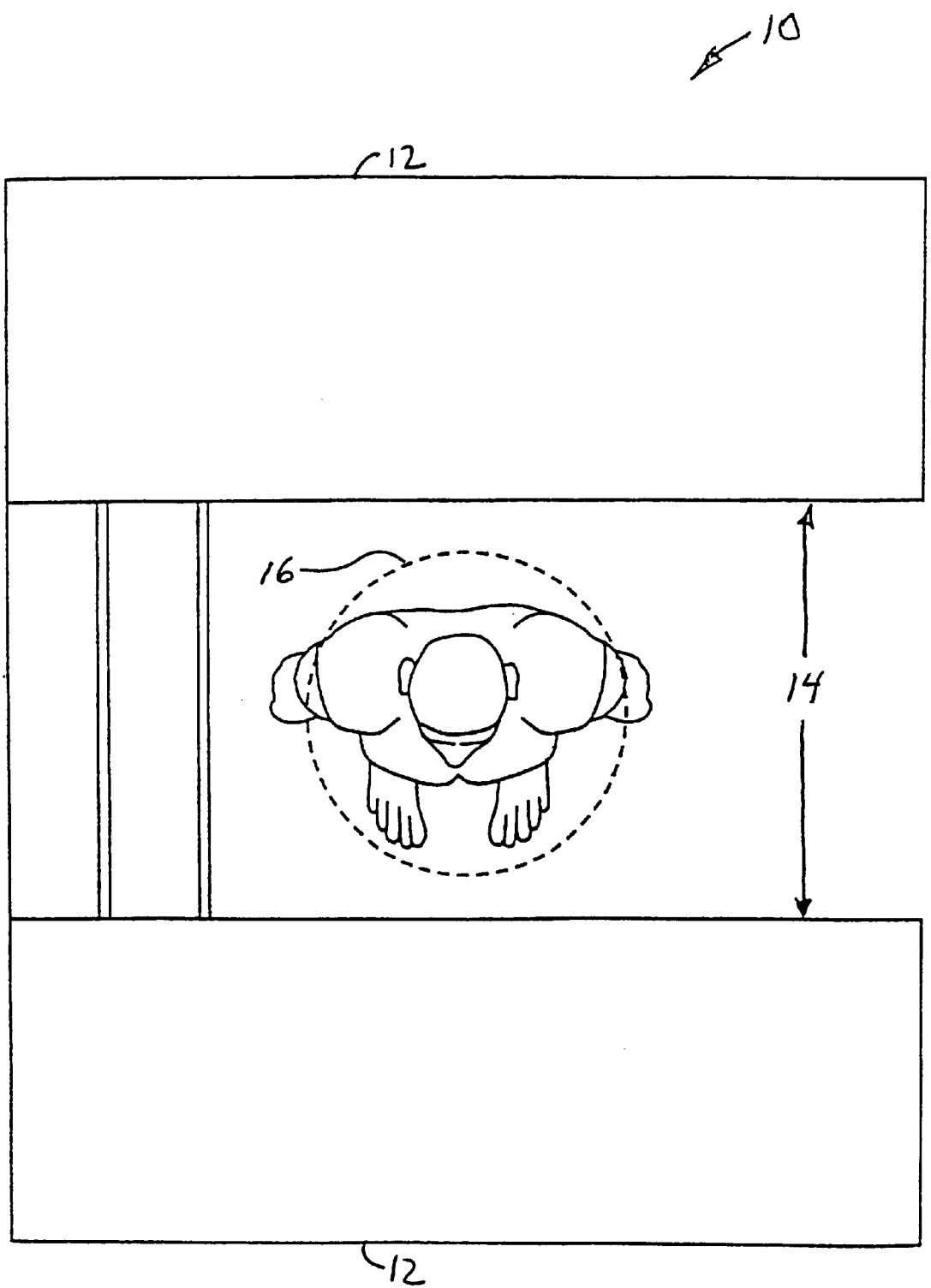
FIG. 1 is a schematic view of an open MRI magnet showing an imaging volume of the magnet.
Figure 2:
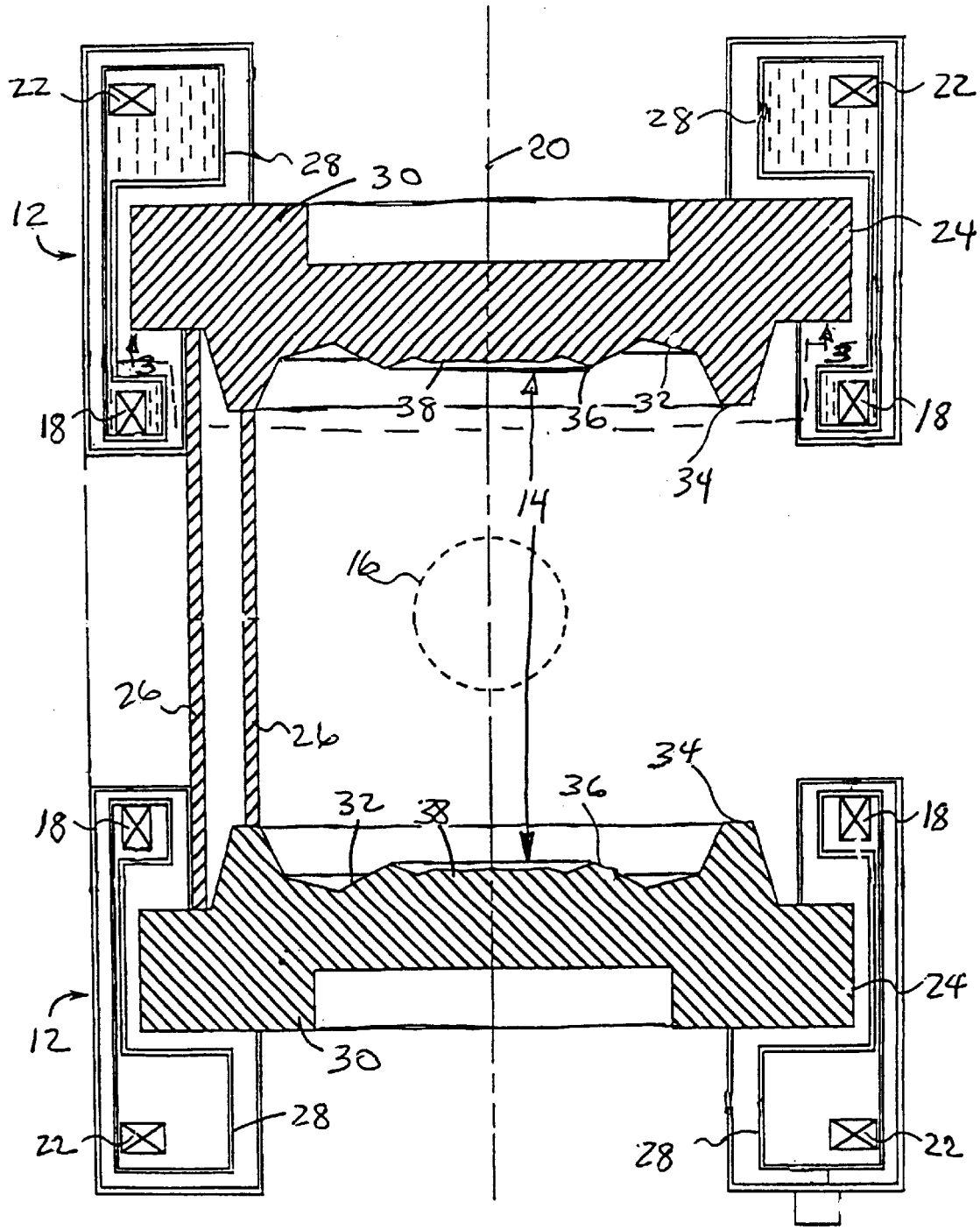
FIG. 2 is a schematic cross-sectional view of a prior art open magnet having field shaping annular steps formed on the inner surfaces of the pole pieces thereof.

Referring now to the drawings and particularly to FIGS. 1 and 2, there is illustrated a prior art open magnet, generally designated 10. The prior art open magnet 10 includes a pair of spaced-apart coil assemblies 12 which are substantially mirror images of one another and form a space 14 therebetween that contains an imaging volume 16. Each coil assembly 12 typically has an annular-shaped main coil 18 with a longitudinal axis 20, an annular-shaped shielding, or bucking, coil 22 coaxially aligned along the longitudinal axis 20 and spaced longitudinally outward and apart from the main coil 18, and a cylindrical-shaped magnetizable pole piece 24 disposed about the longitudinal axis 20 between the main and shielding coils 18, 22. A support member 26 interconnects the two coil assemblies 12 and is made of a nonmagnetizable material, such as stainless steel. The main and shielding coils 18, 22 are typically superconductive and thus cooled to a temperature below their critical temperature to achieve and sustain superconductivity by cryogenic cooling thereof. For achieving the cooling, the open magnet 10 also includes cryogenic vessels 28 containing a liquid cryogen, such as liquid helium, and surrounding the main and shielding coils 18, 22. The pole pieces 24 are disposed outside of and spaced apart from the cryogenic vessels 28 and are made of a ferromagnetic material, such as iron.

The open magnet 10 is not limited to a superconductive magnet but rather can be a resistive magnet or a combination resistive and superconductive magnet. Likewise, the main and shielding coils 18, 22 are not limited to superconductive coils but rather can be resistive or a combination of resistive and superconductive coils.

Figure 3:
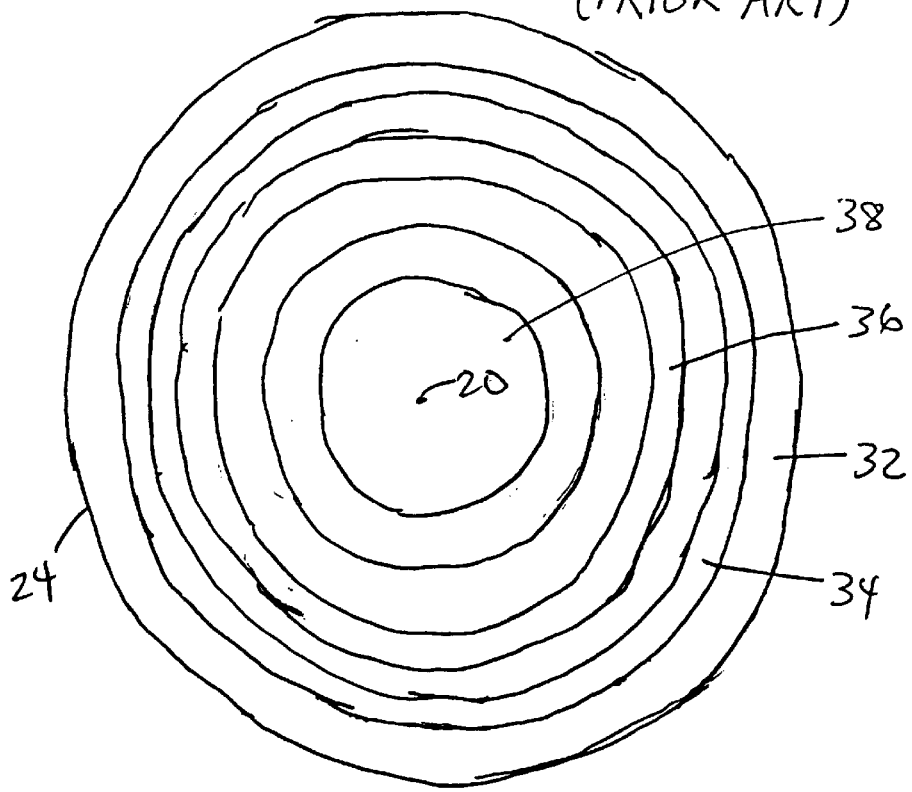
FIG. 3 is a plan view of one of the prior art pole pieces as seen along line 3—3 of FIG. 2.

Referring to FIGS. 2 and 3, the magnetizable pole pieces 24 of the spaced coil assemblies 12 enhance the strength of the magnetic field produced by the main coils 18. The pole pieces 24 comprise magnetizable bodies 30 made of ferromagnetic material and of desired configurations, such as generally cylindrical configurations, with inner surfaces 32 facing toward one another. The inner surfaces 32 of the pole pieces 24 have several annular steps 34, 36, 38 formed thereon which shape the magnetic field of the open magnet 10. As mentioned above, a problem with pole pieces 24 is that they protrude into the space 14 between the coil assemblies 12 and thus reduce the usable volume of the space 14. In addition, the field shaping capacity of the steps technique decreases as the main magnet fields increase, thus tending to produce an unsatisfactory (i.e., non-homogeneous) imaging field for high field open MRI magnets. Another problem is the field fluctuation in the imaging volume due to temperature changes. As room temperature changes, the magnetization of the pole pieces changes, resulting in field fluctuation in the imaging volume and image quality issues.

Figure 5:
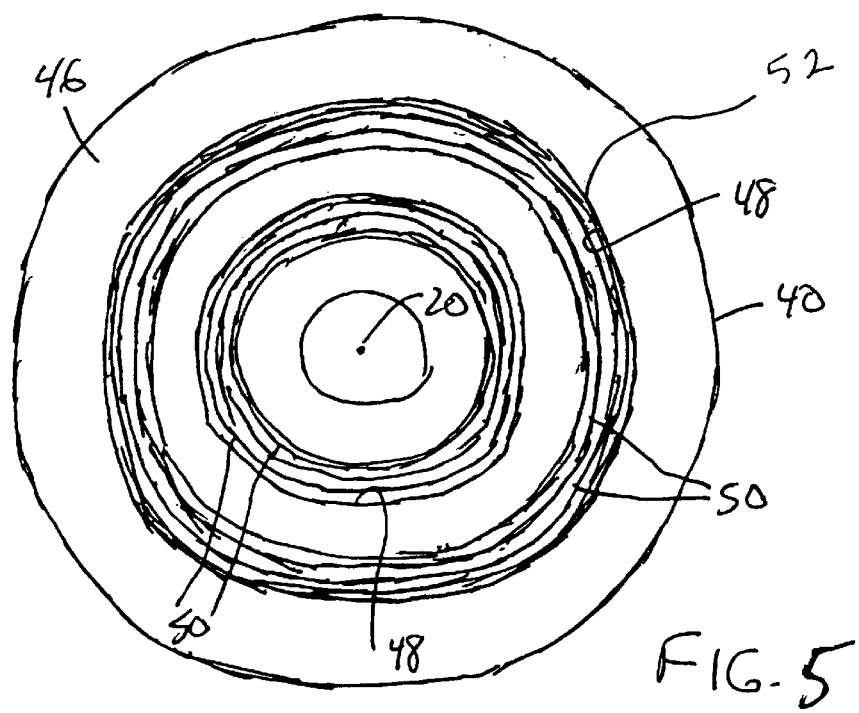
FIG. 5 is a plan view of one of the pole pieces as seen along line 6—6 of FIG. 4.
Figure 4:
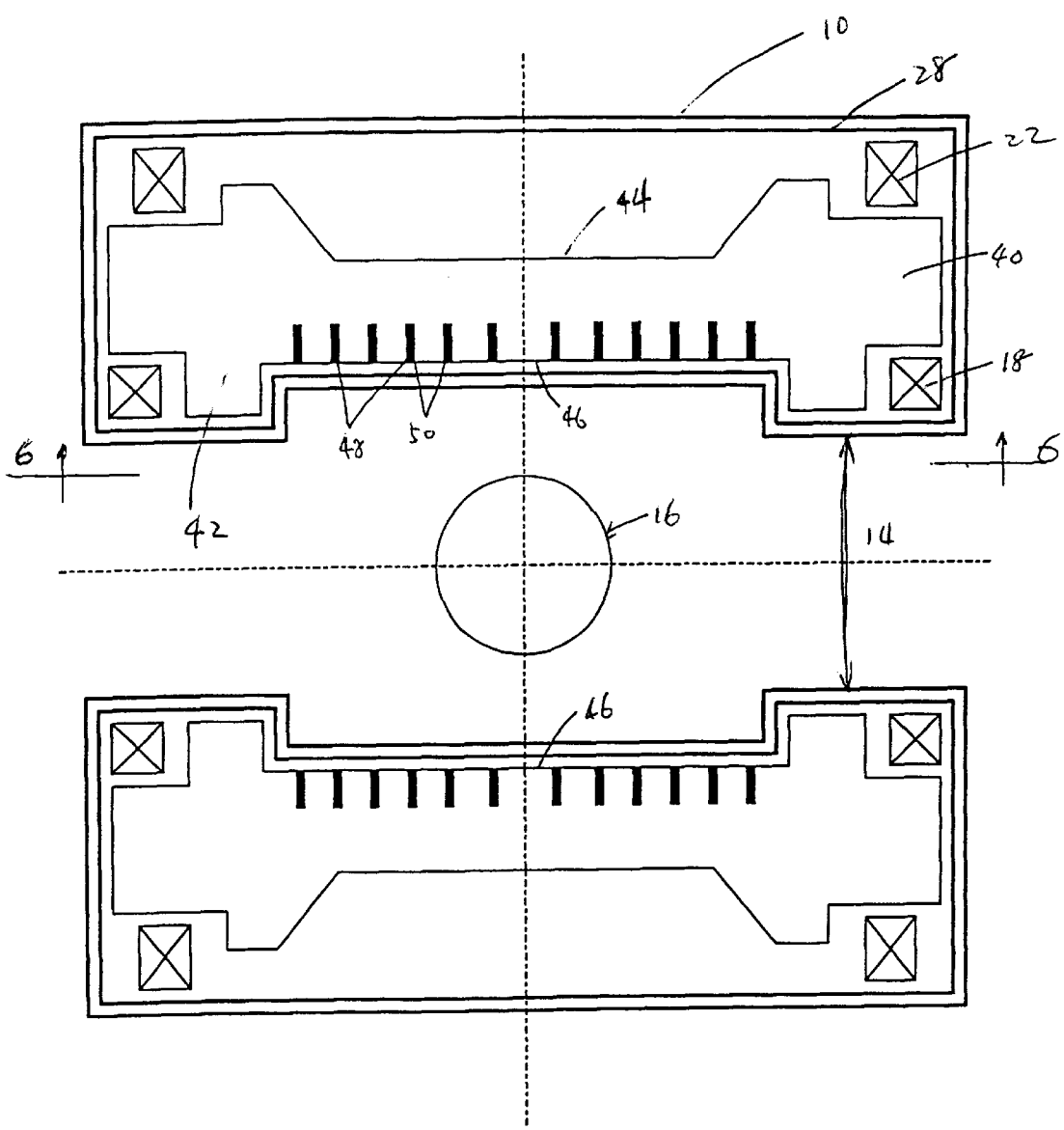
FIG. 4 is a schematic cross-sectional view of pole pieces in accordance with a preferred embodiment of the present invention for use in the open magnet of FIG. 2 with the pole pieces having field shaping coils inserted in annular grooves recessed in the inner surfaces of the pole pieces.

Referring to FIGS. 4 and 5, there is illustrated the pole pieces 40 according to a preferred embodiment of the present invention for use in open magnet 10. Like the prior art pole pieces 24, the pole pieces 40 of FIGS. 4 and 5 have generally cylindrical-shaped magnetizable bodies 42 with respective outer surfaces 44 and inner surfaces 46 facing in a direction generally opposite that of the outer surfaces 44 such that the inner surfaces 46 face toward one another. However, unlike the pole pieces 24, pole pieces 40 of FIGS. 4 and 5 have at least one annular-shaped groove 48 recessed in inner surfaces 46, and an annular-shaped coil 50, either superconductive or resistive, inserted in groove 48. Alternatively, a plurality of annular-shaped, concentrically-arranged, radially-spaced grooves 48 are recessed in inner surfaces 46, and a plurality of annular-shaped coils 50, either superconductive or resistive, are inserted into the respective grooves 48, so as to shape the magnetic field of the open magnet 10. Coils 50 can be pre-wound prior to their insertion into the grooves 48 and then retained in the grooves 48 by means generally indicated at 52, such as by mechanical fastening elements, an interference fit, or an epoxy bond with the magnetizable bodies 42. Current passed through coils 50 redistribute the magnetization of the pole pieces 40 so as to create a homogeneous field in the image volume 16 of the space 14. Pole pieces 24 are placed inside the cryogenic helium vessels 28, thus forming an integrated magnet assembly with the superconducting main coils 18 and bucking coils 22. Such assembly provides a complete electro-magnetic design to satisfy all MRI requirements, including a highly uniform high-field volume for imaging and the containment of the stray field for siting. The advantages of the present invention include a larger unoccupied volume in the space 14 between the coil assemblies 12 and simpler manufacturing of the pole pieces 40 and the magnet cryostat structure. Moreover, temperature induced field fluctuation is avoided by placing pole pieces 40 inside helium vessel 28 in order to operate at a constant liquid helium temperature. Since the pole pieces 40, and the main and bucking coils 18, 22 are structurally connected to form an integrated cold magnet assembly, it is easier to position precisely all the electro-magnetic components, advantageously resulting in a highly uniform field in the image volume 16. Furthermore, axial corrections coils (not shown) can be easily co-wound with the field shaping coils to shim inhomogeneity due to manufacturing tolerances.

While only certain preferred features of the invention have been illustrated and described, many modifications and changes will occur to those skilled in the art. It is, therefore, to be understood that the appended claims are intended to cover all such modifications and changes as fall within the true spirit of the invention.

What is claimed is:

1. A plurality of pole pieces for use in an open magnet, comprising:

magnetizable bodies comprising ferromagnetic material and having respective outer surfaces and inner surfaces facing in a direction generally opposite that of each other, such that said inner surfaces face toward one another, each of said inner surfaces having a plurality of concentrically-arranged, spaced-apart, annular-shaped grooves formed therein;

a plurality of annular-shaped coils comprising electrically conductive material disposed within said grooves in said inner surfaces of said magnetizable bodies substantially behind said inner surfaces; and means for retaining said coils within said grooves in said inner surfaces of said magnetizable bodies;

a cryogenic vessel integrated with each of said pole pieces, each said cryogenic vessel containing a liquid cryogen, and each said pole piece being contained within the respective cryogenic vessel.

2. The plurality of pole pieces of claim 1 in which said bodies is generally cylindrically shaped.

3. The plurality of pole pieces of claim 1 in which said grooves is generally annular-shaped.

4. The plurality of pole pieces of claim 1 in which said plurality of coils is generally annular-shaped.

5. The plurality of pole pieces of claim 1 in which said plurality of coils is pre-wound prior to insertion into said plurality of grooves.

6. The plurality of pole pieces of claim 1 wherein said means for retaining said coils in said grooves comprise a mechanical fastening element.

7. The plurality of pole pieces of claim 1 wherein said means for retaining said coils in said grooves comprise an interference fit between said coils and said bodies.

8. The plurality of pole piece of claim 1 wherein said means for retaining said coils in said grooves comprises an epoxy bond.

9. An open magnet, comprising:

a pair of coil assemblies spaced apart from one another so as to define a space therebetween;

said coil assemblies respectively including:
    annular-shaped main coils defining a common longitudinal axis and spaced apart from one another along said longitudinal axis;
    annular-shaped bucking coils coaxially aligned along said longitudinal axis and longitudinally spaced apart outwardly in opposite directions relative to one another from said main coils; and
    cylindrical-shaped magnetizable pole pieces each disposed about said longitudinal axis between said respective main and bucking coils of one of said coil assemblies;

said pole pieces respectively including:
    magnetizable bodies comprising ferromagnetic material and having respective outer surfaces and inner surfaces facing in a direction generally opposite that of each other, such that said inner surfaces face toward one another, each of said inner surfaces having a plurality of concentrically-arranged, spaced-apart, annular-shaped grooves formed therein;
    a plurality of annular-shaped coils comprising electrically conductive material disposed within said grooves in said inner surfaces of said magnetizable bodies substantially behind said inner surfaces; and
    means for retaining said coils within said grooves in said inner surfaces of said magnetizable bodies;
    a cryogenic vessel integrated with each of said coil assemblies, each said cryogenic vessel containing a liquid cryogen, and each said coil assembly being contained within the respective cryogenic vessel.

10. The magnet of claim 9 in which said coils are pre-wound prior to insertion into said grooves.

11. The magnet of claim 10 in which said means for retaining said coils in said grooves in said inner surfaces of said bodies comprises mechanical fastening elements.

12. The magnet of claim 10 in which said means for retaining said coils in said grooves comprises an interference fit between said coils and said bodies.

13. The magnet of claim 10 in which said means for retaining said coils in said grooves comprises epoxy bonds.

* * * * *